United States Patent
Zhe et al.

(10) Patent No.: US 8,013,404 B2
(45) Date of Patent: Sep. 6, 2011

(54) FOLDED LEAD-FRAME PACKAGES FOR MEMS DEVICES

(75) Inventors: Wang Zhe, Singapore (SG); Chong Ser Choong, Singapore (SG)

(73) Assignee: Shandong Gettop Acoustic Co. Ltd., Shandong (CN)

( * ) Notice: Subject to any disclaimer, the term of this patent is extended or adjusted under 35 U.S.C. 154(b) by 320 days.

(21) Appl. No.: 12/287,466

(22) Filed: Oct. 9, 2008

(65) Prior Publication Data

US 2010/0090295 A1    Apr. 15, 2010

(51) Int. Cl.
*H01L 29/82* (2006.01)
(52) U.S. Cl. ........ 257/415; 257/418; 257/666; 257/704; 257/E23.193
(58) Field of Classification Search .......... 257/704–711, 257/676, 659–666; 438/613–618
See application file for complete search history.

(56) References Cited

U.S. PATENT DOCUMENTS

| | | | |
|---|---|---|---|
| 5,218,510 A * | 6/1993 | Bradford | 361/220 |
| 7,166,911 B2 | 1/2007 | Karpman et al. | |
| 7,202,552 B2 | 4/2007 | Zhe et al. | |
| 7,242,089 B2 | 7/2007 | Minervini | |
| 7,375,416 B2 | 5/2008 | Retuta et al. | |
| 7,419,853 B2 | 9/2008 | Kuhmann et al. | |
| 2008/0150104 A1 | 6/2008 | Zimmerman et al. | |
| 2010/0155863 A1* | 6/2010 | Weekamp | 257/416 |

* cited by examiner

*Primary Examiner* — Dung A. Le
(74) *Attorney, Agent, or Firm* — Saile Ackerman LLC; Stephen B. Ackerman; Rosemary L. S. Pike (57) ABSTRACT

The MEMS package comprises a first and a second pre-molded lead-frame substrate, at least one of them having a cavity formed by plastic sidewalls along its periphery. The first and second pre-molded lead-frame substrates are interconnected with metal leads. At least one MEMS device is attached to one of the substrates. The first pre-molded lead-frame substrate is folded over and joined to the second pre-molded lead-frame substrate to house the at least one MEMS device. In one embodiment, the first pre-molded lead-frame substrate has metal leads extending outside of sidewalls of the cavities. The extended metal leads are folded over the top of the second pre-molded lead-frame substrate to form surface mounting pads. In some embodiments, extended metal leads are folded along the sidewalls and connected to ground for electromagnetic interference (EMI) shielding.

16 Claims, 8 Drawing Sheets

FOLDED LEAD-FRAME PACKAGES FOR MEMS DEVICES

BACKGROUND OF THE INVENTION (1) Field of the Invention

The invention relates to processes for packaging MEMS devices, and MEMS packages produced using the method, and more particularly, to a method of packaging MEMS devices using lead-frame packages.

(2) Description of the Related Art

Micro-electro-mechanical systems (MEMS) devices are known which convert physical phenomena, such as pressure, acceleration, sound, or light, into electrical signals. Each type of MEMS device interacts with the world in a different way, and demands custom or at least semi-custom packaging solutions. So-called system-in-package techniques attempt to form an entire microsystem—which could include a microprocessor, communications components, actuators and sensors—within a single package. However, packaging of a MEMS device is totally different from packaging an integrated circuit device. MEMS devices are categorically different from ICs despite sharing some fundamental processing technologies. Packaging is the biggest challenge for commercializing most MEMS devices. The term "MEMS package" is used in this document to imply a package including at least one MEMS device.

The packaging requirements for a MEMS microphone or acoustic sensor are complex because the devices need to have an open path to receive sound pressure and yet the devices need to be protected from external environmental hazards like particles, dust, corrosive gases and humidity. In addition, the device must have an acoustic chamber to be functional. A sufficient acoustic chamber is an essential requirement to guarantee the desired performance of any microphone/acoustic sensor. An insufficient acoustic chamber will damp the diaphragm movement and increase the acoustic noise. In considerations of packaging a MEMS device, it is also desired to avoid expensive processes and costly substrate and assembly materials.

Figure 1:
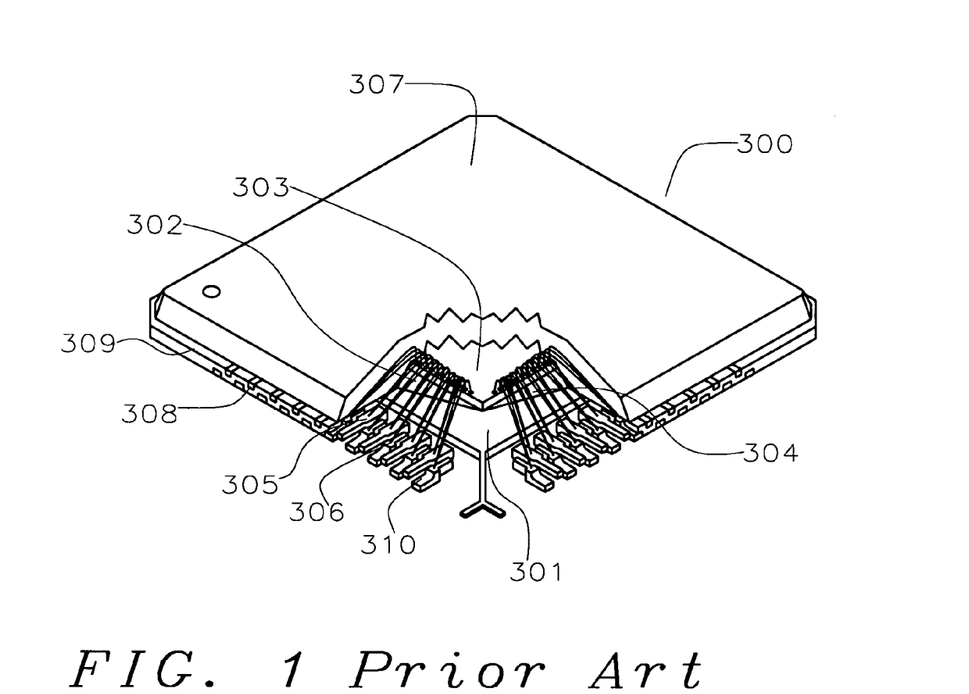
FIGS. 1 through 4 schematically illustrate in cross-sectional representation MEMS package concepts of the prior art.

For example, FIG. 1 illustrates a MEMS package as disclosed in U.S. Pat. No. 7,375,416 (Retuta et al). This is a lead-frame method used to produce a multi-row semiconductor package. Surface Mount Technology (SMT) pads are used for external connections. However, this lead-frame package has plastic 307 molded over the semiconductor IC devices and is not suitable for MEMS devices with movable structures on their top surfaces.

Figure 2:
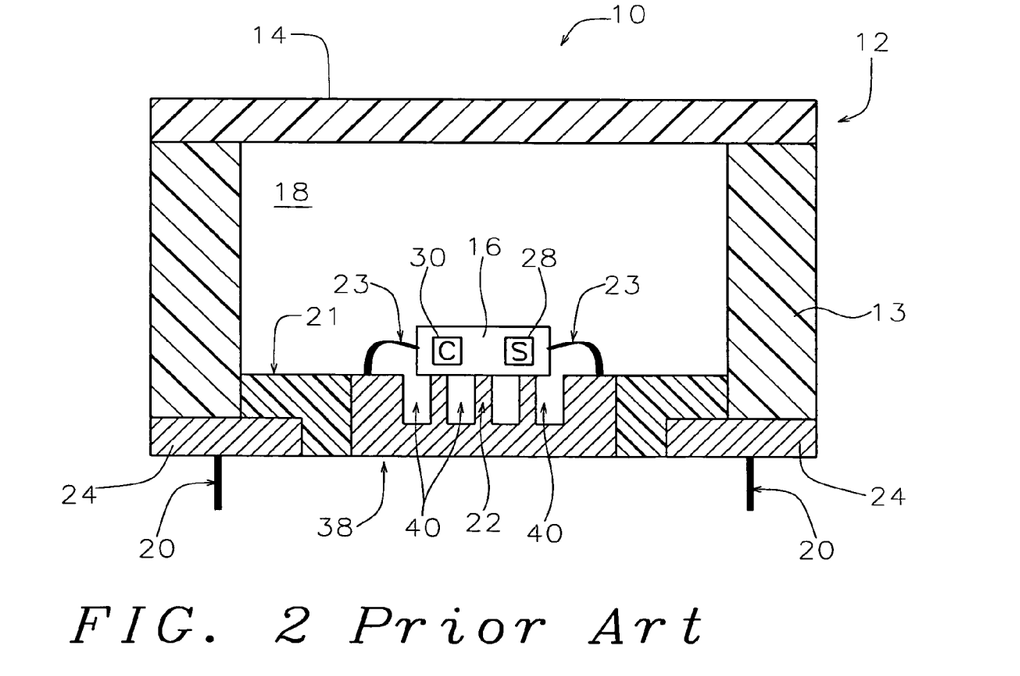

FIG. 2 illustrates a MEMS package as disclosed in U.S. Pat. No. 7,166,911 (Karpman et al). A MEMS inertial sensor 16 is secured within a pre-molded type package formed from a low moisture permeable molding material. Pins 20 are provided for external connections. The premolded package does not have an inlet to provide environmental communication with the MEMS sensor and the pre-molded plastic sidewalls of the package do not offer electromagnetic interference (EMI) shielding.

Figure 3:
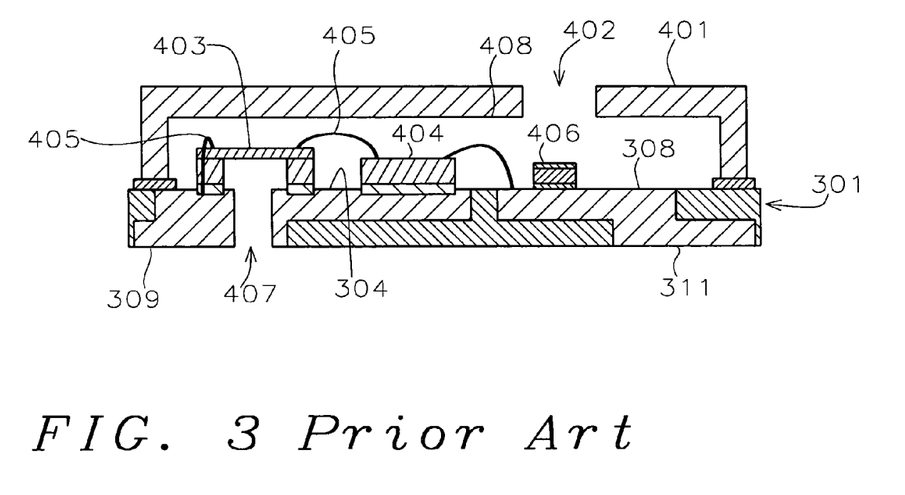

U.S. Patent Application 2008/0150104 (Zimmerman et al) discloses a premolded lead-frame package having an opening 407 to the MEMS sensor 403 and having EMI shielding in a conductive cover 401, shown in FIG. 3. However, such a package cannot provide a sufficient acoustic chamber for MEMS acoustic element 403 when the sound comes from inlet 402.

Figure 4:
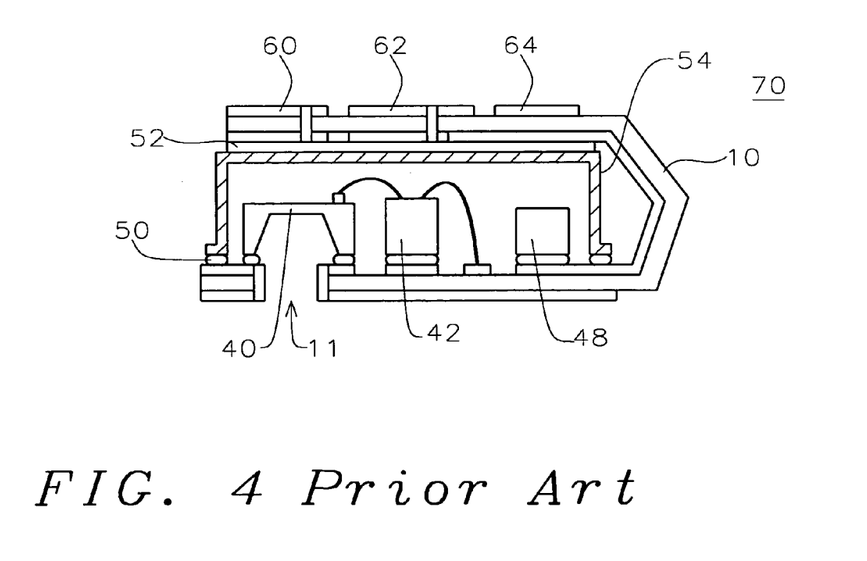

U.S. Pat. No. 7,202,552 (Wang et al) teaches methods of using flexible printed circuit boards and folding processes to make MEMS packages, as shown in FIG. 4. An opening 11 for sound energy and SMT pads 64 for external connection are shown. However, the flexible substrate material is not easy to handle in the assembly process and is expensive compared with lead-frame substrates.

U.S. Pat. No. 7,242,089 (Minervini) teaches that an FR-4 substrate is preferred over a plastic body/lead-frame design because of its flexibility in changing product design. But, an FR-4 substrate is still a more expensive alternative compared to a lead-frame package. U.S. Pat. No. 7,419,853 (Kuhmann et al) shows leads extending along the sides of a silicon cap structure.

SUMMARY OF THE INVENTION

A principal object of the present invention is to provide a cost-effective and very manufacturable method of packaging MEMS devices wherein the method includes a lead-frame based package.

Another object of the invention is to provide a MEMS sensor package comprising a lead-frame based package.

A further object of the invention is to provide a method of packaging MEMS devices in a lead-frame package incorporating one or more cavities formed by the plastic wall.

A further object of the invention is to provide a MEMS lead-frame package incorporating one or more cavities formed by the plastic wall.

A still further object is to provide a method of packaging MEMS devices in a lead-frame package that is folded over to extend electrical connections on both sides and forms an enclosed cavity wherein one or more dies or components are located inside the cavity.

A still further object is to provide a MEMS lead-frame package that is folded over to extend electrical connections on both sides and forms an enclosed cavity wherein one or more dies or components are located inside the cavity.

Yet another object of the invention is to provide a method of packaging MEMS devices in a lead-frame package that incorporates a metallic sidewall forming an EMI shield for the package.

Yet another object of the invention is to provide a MEMS lead-frame package that incorporates a metallic sidewall forming an EMI shield for the package.

Yet another object is to provide a method of packaging MEMS devices in a lead-frame package that has an inlet hole whereby an external signal can enter into the package and reach the MEMS device.

Yet another object is to provide a MEMS lead-frame package that has an inlet hole whereby an external signal can enter into the package and reach the MEMS device.

A yet further object is to provide a method of packaging MEMS devices in a lead-frame package wherein the metal leads of the lead-frame are folded over to form metal pads for surface mounting on a circuit board.

Another object is to provide a MEMS lead-frame package wherein the metal leads of the lead-frame are folded over to form metal pads for surface mounting on a circuit board.

In accordance with the objects of this invention an improved MEMS package is achieved. The MEMS package comprises a first and a second pre-molded lead-frame substrate, at least one of them having a cavity formed by plastic sidewalls along its periphery. The first and second pre-molded lead-frame substrates are interconnected with metal leads. At least one MEMS device is attached to one of the substrates. The first pre-molded lead-frame substrate is folded over and joined to the second pre-molded lead-frame substrate to house the at least one MEMS device Also in accordance with the objects of this invention, another MEMS package is achieved. The MEMS package comprises a first and a second pre-molded lead-frame substrate, at least one of them having a cavity formed by plastic sidewalls along its periphery. The first and second pre-molded lead-frame substrates are interconnected with metal leads. At least one MEMS device is attached to one of the substrates. The first pre-molded lead-frame substrate is folded over and joined to the second pre-molded lead-frame substrate to house the at least one MEMS device. Furthermore, the first pre-molded lead-frame substrate has metal leads extending outside of side walls of the cavities. The extended metal leads are folded over the top of the second pre-molded lead-frame substrate to form surface mounting pads.

Also in accordance with the objects of this invention, another MEMS package is achieved. The MEMS package comprises a first and a second pre-molded lead-frame substrate, at least one of them having a cavity formed by plastic sidewalls along its periphery. The first and second pre-molded lead-frame substrates are interconnected with metal leads. At least one MEMS device is attached to one of the substrates. The first pre-molded lead-frame substrate is folded over and joined to the second pre-molded lead-frame substrate to house the at least one MEMS device. Furthermore, the first pre-molded lead-frame substrate has metal leads extending outside of side walls of the cavities. The extended metal leads are folded along the sidewalls and connected to ground for electromagnetic interference shielding.

Also in accordance with the objects of this invention a method of producing an improved MEMS package is achieved. A first and a second pre-molded lead-frame substrate are provided, at least one of them having a cavity formed by plastic sidewalls along its periphery. The first and second pre-molded lead-frame substrates are interconnected with metal leads. At least one MEMS device is attached to one of the substrates wherein the substrate has a through-hole therein wherein an external signal can enter through the through-hole and reach the at least one MEMS device. The first pre-molded lead-frame substrate is folded over and joined to the second pre-molded lead-frame substrate to house the at least one MEMS device. In one embodiment, metal leads extend outside the sidewalls of the cavity of the first pre-molded lead-frame substrate. The extended metal leads are folded over the top of the second pre-molded lead-frame substrate to form surface mounting pads. In some embodiments, extended metal leads are folded along the sidewalls and connected to ground to provide electromagnetic interference shielding.

BRIEF DESCRIPTION OF THE DRAWINGS

In the accompanying drawings forming a material part of this description, there is shown.

DESCRIPTION OF THE PREFERRED EMBODIMENTS

The present invention proposes a method for packaging a MEMS microphone or sensor device. One or more electronic components could also be included in the package. The present invention provides cost-effective lead-frame based packaging for MEMS devices. The lead-frame incorporates one or more cavities formed by the plastic wall. The lead-frame is folded over and forms an enclosed cavity wherein one or more dies or components are located inside the cavity. The package incorporates folded metal leads onto the plastic sidewalls for EMI shielding. The package has an inlet hole whereby the external signal can enter into the package and reach the MEMS die. In one embodiment, the metal leads of the lead-frame are folded over to form metal pads for surface mounting on an application circuit board.

Figure 5:
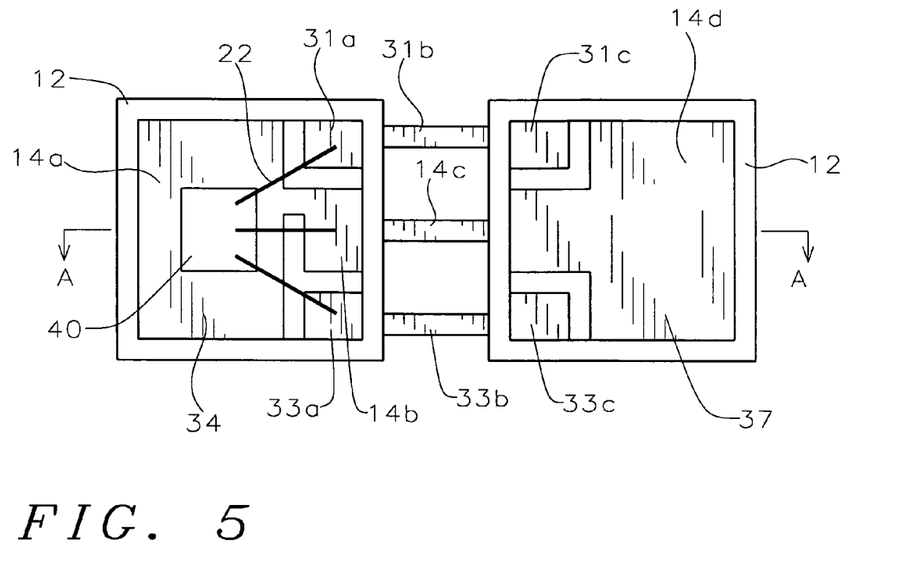
FIG. 5 schematically illustrates a planar view of a first preferred embodiment of the present invention.
Figure 6:
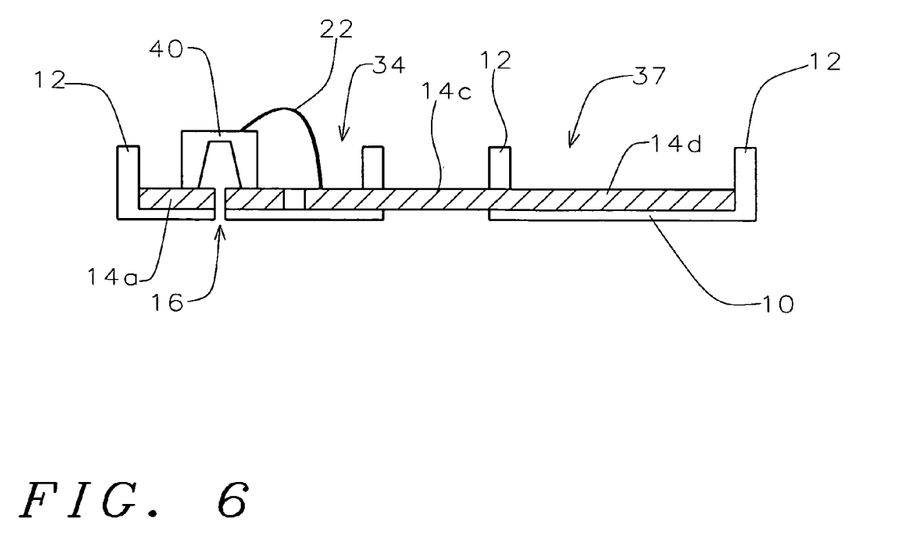
FIGS. 6 and 7 illustrate in cross-sectional representation the first preferred embodiment of the present invention.
Figure 7:
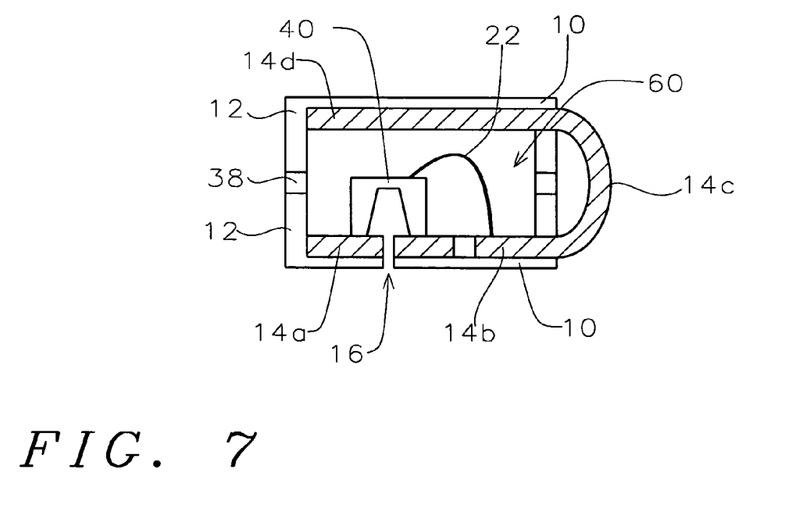
Figure 8:
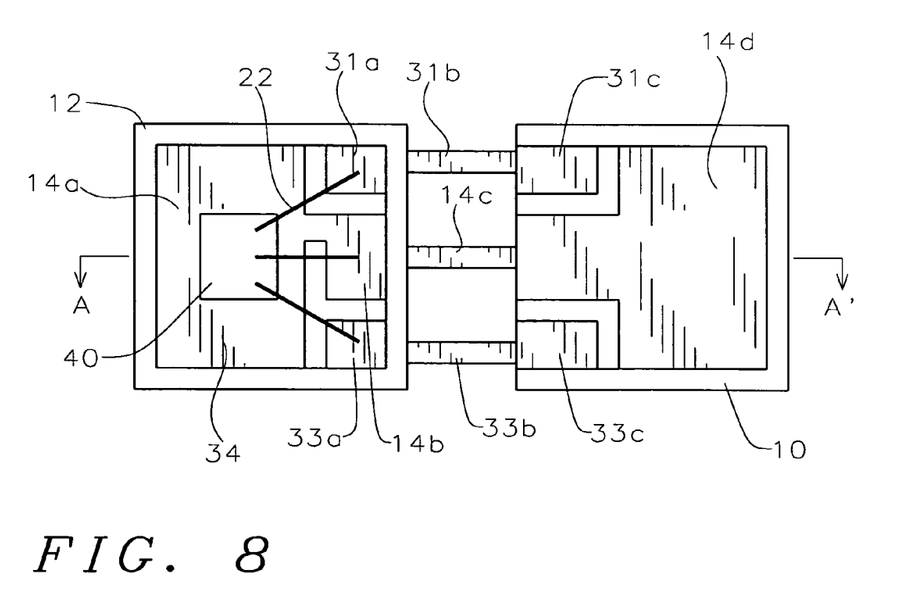
FIG. 8 schematically illustrates a planar view of a second preferred embodiment of the present invention.
Figure 9:
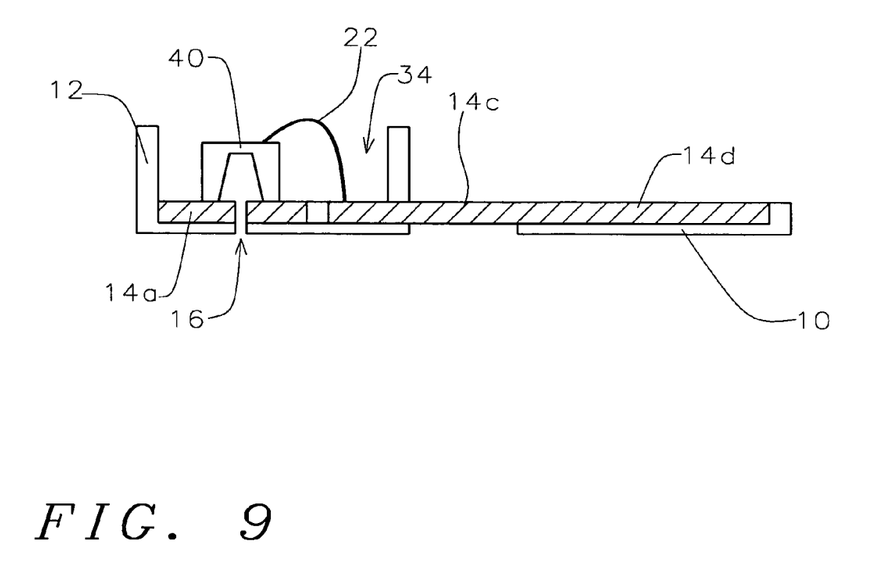
FIGS. 9 and 10 illustrate in cross-sectional representation the second preferred embodiment of the present invention.
Figure 10:
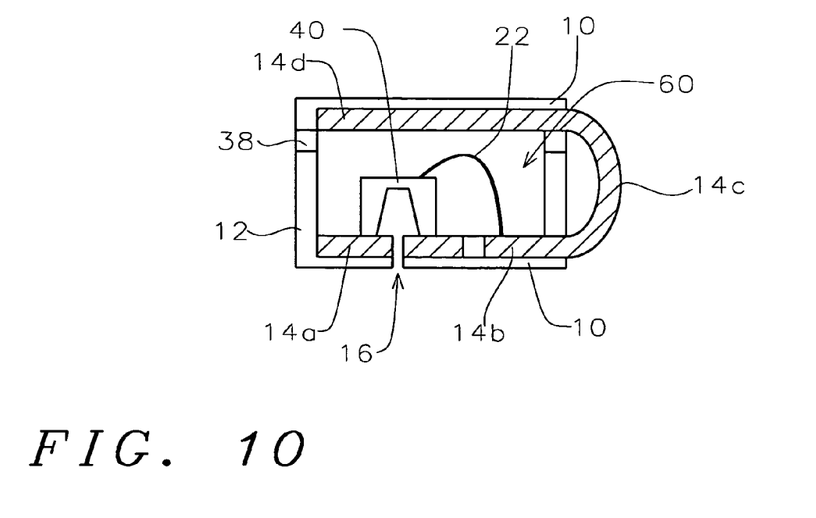
Figure 11:
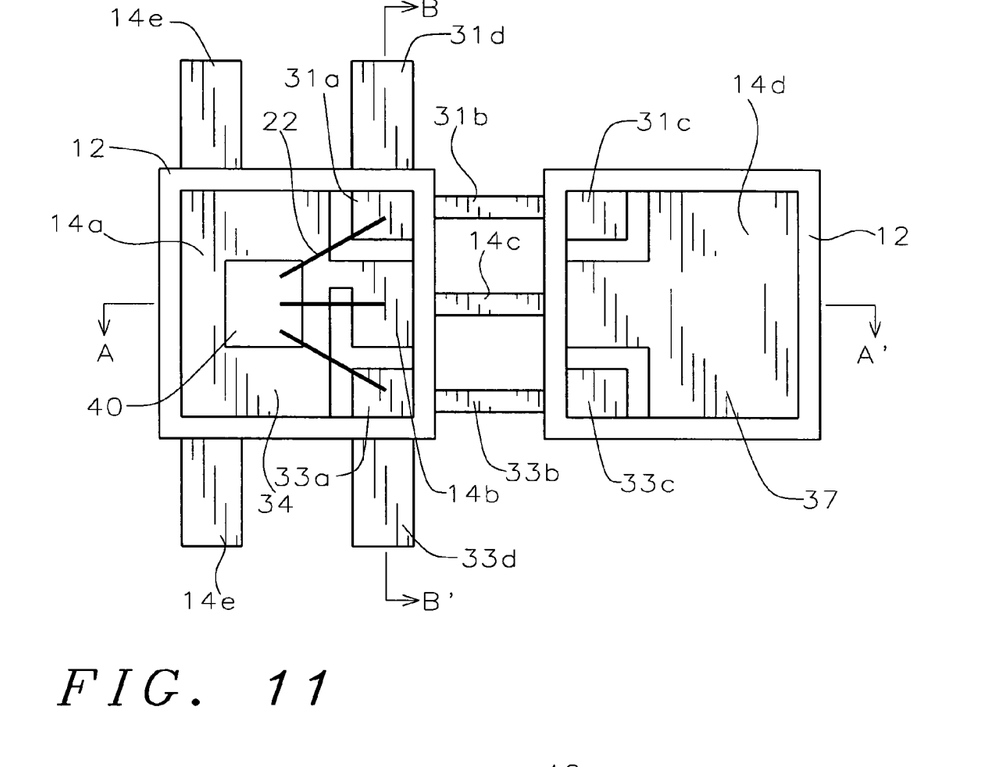
FIG. 11 schematically illustrates a planar view of a third preferred embodiment of the present invention.
Figure 12:
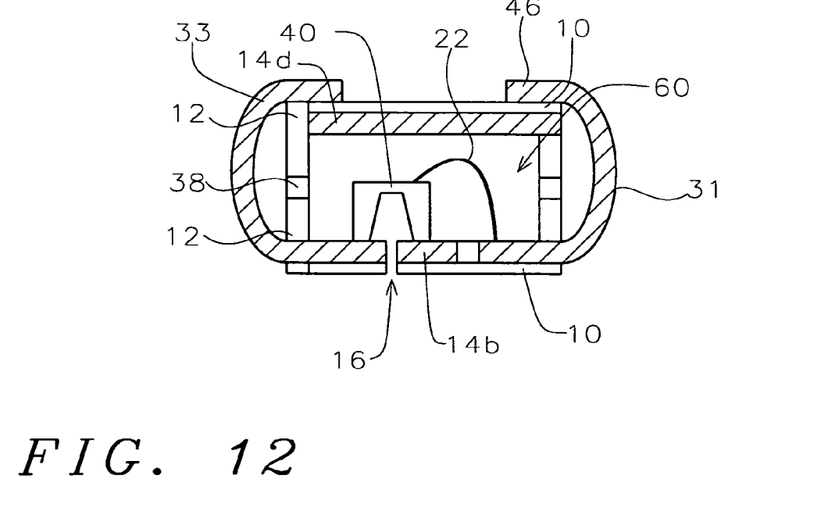
FIG. 12 illustrates in cross-sectional representation the third preferred embodiment of the present invention.
Figure 13:
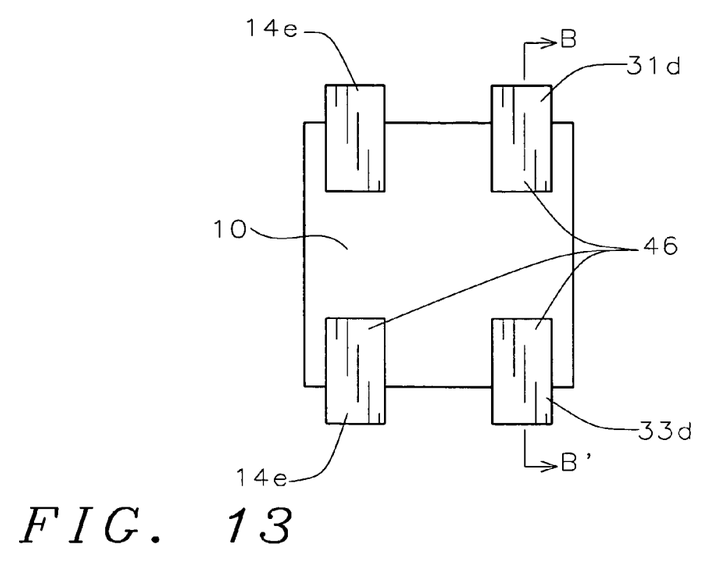
FIG. 13 schematically illustrates a top view of the third preferred embodiment of the present invention.
Figure 14:
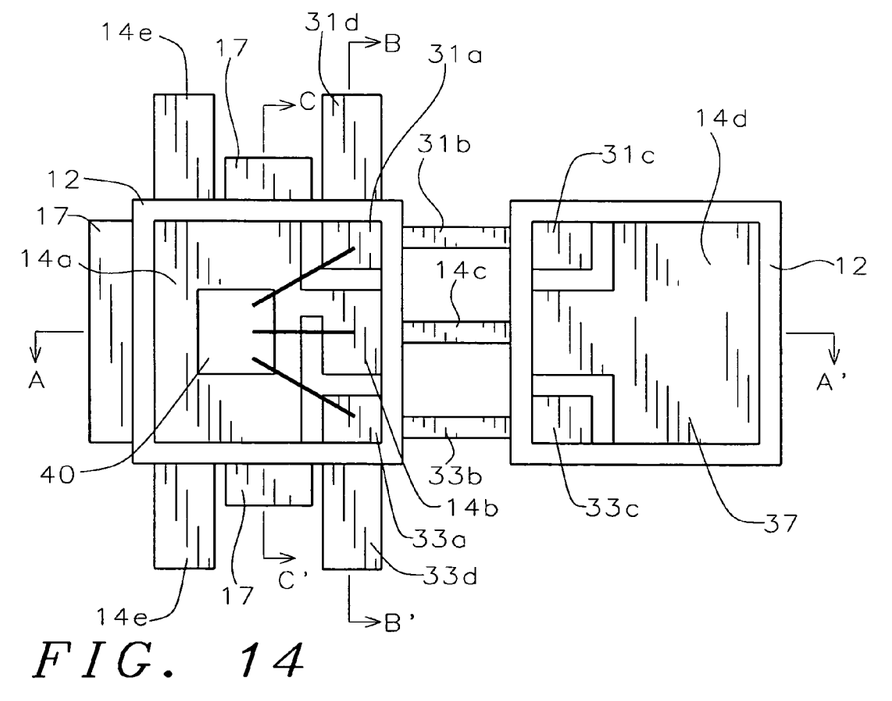
FIG. 14 illustrates a planar view of a fourth preferred embodiment of the present invention.
Figure 15:
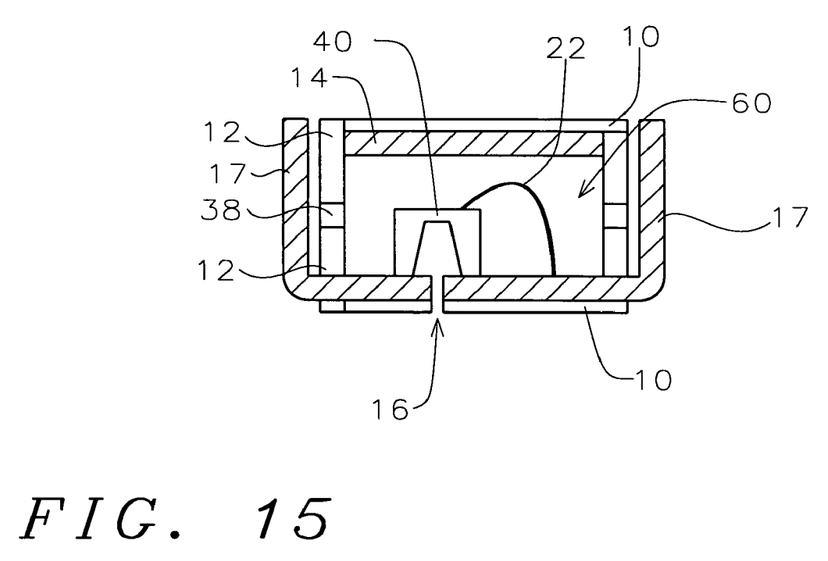
FIGS. 15 and 16 schematically illustrate in cross-sectional representation the fourth preferred embodiment of the present invention.
Figure 16:
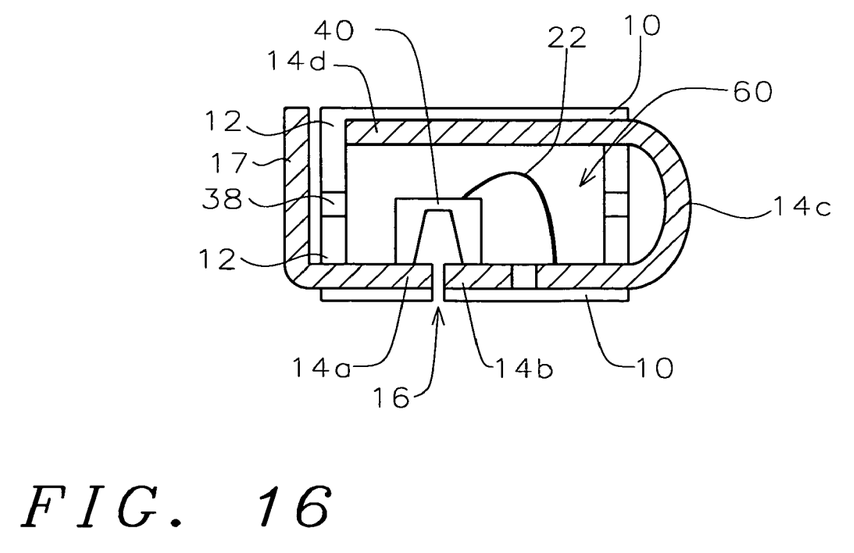

Four preferred embodiments of the invention are illustrated in the drawing figures. FIGS. 5-7 illustrate the first embodiment, FIGS. 8-10 illustrate the second embodiment, FIGS. 11-13 illustrate the third embodiment, and FIGS. 14-16 illustrate the fourth embodiment.

Referring now more particularly to FIGS. 5-7, the first preferred embodiment of the present invention will be described. FIG. 5 illustrates a planar view of two interconnected pre-molded lead-frame cavity substrates. FIG. 6 illustrates the cross-section A-A' of FIG. 5. The lead-frame 10 consists of pre-molded plastic including plastic sidewalls 12. Metal leads 14, 31, and 33 are interconnected with the pre-molded plastic of the lead-frame. One or more cavities are formed by the plastic walls 12, as shown in FIG. 5. For example, FIG. 5 shows cavity 34 in the first pre-molded lead-frame on the left side of the drawing and cavity 37 in the second pre-molded lead-frame on the right side of the drawing. One of the metal leads 14a has a through-hole 16 extending through the metal lead and the underlying pre-molded plastic layer, as shown in FIG. 6. An external signal can enter through the through-hole 16 and reach the MEMS chip 40.

At least one or more dies are attached to the metal lead 14 by adhesives. For simplicity of illustration, one MEMS device 40 is shown. It will be understood that the MEMS package of the invention comprises at least one MEMS device, but that more than one MEMS device may be included. One or more electronic components, such as an integrated circuit (IC), typically, an application specific IC (ASIC) may be included in the package. Alternately, a single chip with an integrated circuit and MEMS sensing elements integrated thereon may be used. Preferably, the adhesive used to attach a MEMS device onto the metal lead 14a is a low modulus adhesive for stress relaxation, such as a silicone-based adhesive.

Next, wire bonding is carried out. For example, wire bonds 22 are attached between the MEMS chip 40 and metal leads at 31a, 14b, and 33a, as shown in FIG. 5.

The lead-frame with bonded chips is then subjected to a "Trim & Form" process to form an individual package. In this standard IC packaging process, metal leads are cut off and formed in different shapes as shown in the drawing figures. As illustrated in cross-section in FIG. 7, the cavities formed by the plastic walls 12 are joined together by folding and attached by either adhesive paste or pre-cut adhesive film 38 to form an enclosed chamber 60. This completes the package that houses the MEMS devices.

Referring now to FIGS. 8-10, the second preferred embodiment of the present invention is described. FIG. 8 illustrates a planar view of two interconnected pre-molded lead-frame substrates. FIG. 9 illustrates the cross-section A-A' of FIG. 8. Metal leads 14, 31, and 33 are interconnected with the pre-molded plastic of the lead-frame. This embodiment is exactly the same as the first embodiment except that only one of the pre-molded lead-frame substrates 10 has a cavity formed by plastic sidewalls 12. For example, FIG. 8 shows cavity 34 in the first pre-molded lead-frame on the left side of the drawing. As better shown in the cross-sectional view in FIG. 9, the second pre-molded lead-frame on the right side of the drawing does not have plastic sidewalls forming a cavity. As illustrated in cross-section in FIG. 10, the cavity 34 formed by the plastic walls 12 in the first plastic substrate is joined to the second pre-molded lead-frame substrate 10 by folding. The pre-molded lead-frame substrates 10 are attached by either adhesive paste or pre-cut adhesive film 38 to form an enclosed chamber 60. This completes the package that houses the MEMS devices.

A third preferred embodiment of the present invention provides for a surface mount package, illustrated in FIGS. 11-13. FIG. 11 illustrates a planar view of two interconnected pre-molded lead-frame cavity substrates. FIG. 12 illustrates the cross-section A-A' of FIG. 11. FIG. 13 illustrates a top view of the folded lead-frame package along the B-B' axis shown in FIG. 11. The lead-frame 10 consists of pre-molded plastic including plastic sidewalls 12 and metal leads 14. Cavities are formed by the plastic walls 12, as shown in FIG. 11. One of the metal leads 14a has a through-hole 16 extending through the metal lead and through the underlying pre-molded plastic, as shown in FIG. 12. An external signal can enter through the through-hole 16 and reach the MEMS chip 40, shown in FIG. 12.

At least one or more dies are attached to the metal lead 14 by adhesives. It will be understood that the MEMS package of the invention comprises at least one MEMS device, but that more than one MEMS device may be included. One or more electronic components, typically, application specific IC's (ASIC) may be included in the package. FIG. 11 illustrates a single chip 40 with an integrated circuit and MEMS sensing elements integrated thereon. Preferably, the adhesive used to attach the MEMS chip onto the metal lead 14a is a low modulus adhesive for stress relaxation, such as a silicone-based adhesive.

Next, wire bonding is carried out. For example, wire bonds 22 are attached between the MEMS chip 40 and metal leads at 31a, 14b, and 33a, as shown in FIG. 11. The metal leads 31 and 33 have extended metal leads 31d and 33d, respectively, outside the first pre-molded lead-frame substrate. The metal lead 14b is connected to metal lead 14a which has extended metal leads 14e outside the first pre-molded lead-frame substrate The lead-frame with bonded chips is then subjected to a "Trim & Form" process to form an individual package. The cavities formed by the plastic walls 12 are joined together by folding and attached by either adhesive paste or pre-cut adhesive film 38 to form an enclosed chamber 60. Trimmed and formed metal traces 31 and 33 are shown on both sides of the completed package in the cross-section of view B-B' in FIG. 12. Metal leads 31d and 33d are folded over to form SMT pads 46 on the top side of the package as shown in cross-section in FIG. 12 and in top view in FIG. 13. FIG. 13 also shows metal leads 14e folded over to form SMT pads 46. The cross-section of view A-A' is the same as in FIG. 7. It will be understood that the pre-molded lead-frame substrates of the second embodiment, wherein a cavity is formed in only one of the pre-molded lead-frame substrates, can be used in this embodiment instead of the two cavities shown in the figures.

A fourth preferred embodiment of the present invention is illustrated in FIGS. 14-16. In this embodiment, electromagnetic interference (EMI) shielding is provided in the package. FIG. 14 illustrates a planar view of two interconnected pre-molded lead-frame cavity substrates. FIG. 15 illustrates the cross-section C-C' of FIG. 14. The lead-frame 10 consists of pre-molded plastic including plastic sidewalls 12 and metal leads 14. Cavities are formed by the plastic walls 12, as shown in FIG. 14. One of the metal leads 14a has a through-hole 16 extending through the metal lead and the underlying plastic, as shown in FIG. 15. An external signal can enter through the through-hole 16 and reach the MEMS chip 40, shown in FIG. 15. The lead-frame package in FIG. 14 is the same as in the first embodiment. It will be understood that the pre-molded lead-frame substrates of the second embodiment, wherein a cavity is formed in only one of the pre-molded lead-frame substrates, can be used in this embodiment instead of the two cavities shown in the figures.

In addition, metal leads 14e, 31d, and 33d may be provided as in the third embodiment to form surface mounting pads. Furthermore, in this embodiment, grounded metal leads 17 are provided at the sides of the package. These are extended portions of metal lead 14a.

At least one or more dies are attached to the metal lead 14 by adhesives. It will be understood that the MEMS package of the invention comprises at least one MEMS device, but that more than one MEMS device may be included. One or more electronic components, typically, application specific IC's (ASIC) may be included in the package. FIG. 14 illustrates a single chip 40 with an integrated circuit and MEMS sensing elements integrated thereon. Preferably, the adhesive used to attach the MEMS chip onto the metal lead 14a is a low modulus adhesive for stress relaxation, such as a silicone-based adhesive.

Next, wire bonding is carried out. For example, wire bonds 22 are attached between the MEMS chip 40 and metal leads at 31a, 14b, and 33a, as shown in FIG. 14.

The lead-frame with bonded chips is then subjected to a "Trim & Form" process to form an individual package. The cavities formed by the plastic walls 12 are joined together by folding and attached by either adhesive paste or pre-cut adhesive film 38 to form an enclosed chamber 60. One or more metal leads 17 are bent at a right angle to form a vertical sidewall. Trimmed and formed metal leads 17 are shown forming vertical sidewalls on both sides of the completed package in the cross-section of view C-C' in FIG. 15. The plastic wall is blocked from the external environment by the vertical sidewall formed by the metal leads. The vertical sidewall is connected to ground and thus forms an EMI shield for the package.

FIG. 16 illustrates the view A-A' of the package showing grounded metal lead 17 forming a vertical sidewall for EMI shielding. If SMT pads are to be formed, metal leads 14e, 31d, and 33d are folded over to form surface mounting pads 46 on the top side of the package as shown in top view in F*ig*. 13.

The present invention provides MEMS packages and methods of manufacturing these packages. One or more electronic components could also be included in the package. The present invention provides cost-effective lead-frame based packaging for MEMS devices. The pre-molded lead-frame incorporates one or more cavities formed by the plastic wall. The pre-molded lead-frame is folded over and forms an enclosed cavity wherein one or more dies or components are located inside the cavity. The package has an inlet hole whereby the external signal can enter into the package and reach the MEMS die. In one embodiment, the extended metal leads of the lead-frame are trimmed and formed to provide the pads for surface mounting on an application circuit board. In some embodiments, the package incorporates a metallic sidewall forming an EMI shield for the package.

While the invention has been particularly shown and described with reference to the preferred embodiments thereof, it will be understood by those skilled in the art that various changes in form and details may be made without departing from the spirit and scope of the invention.

What is claimed is:

1. A MEMS package comprising:
 a first and a second pre-molded lead-frame substrate, at least one of them having a cavity formed by plastic sidewalls along its periphery, wherein said first and second pre-molded lead-frame substrates are interconnected with metal leads; and
 at least one MEMS device attached to one of said substrates wherein said first pre-molded lead-frame substrate is folded over and joined to said second pre-molded lead-frame substrate to house said at least one MEMS device.

2. The package according to claim 1 wherein said first pre-molded lead-frame substrate has metal leads extending outside of sidewalls of said cavity wherein extended said metal leads are trimmed and folded over the top of said second pre-molded lead-frame substrate to form surface mounting pads.

3. The package according to claim 1 wherein said first pre-molded lead-frame substrate has metal leads extending outside of sidewalls of said cavity wherein extended said metal leads are trimmed and folded along said side walls and connected to ground for electromigration shielding.

4. The package according to claim 1 wherein one of said metal leads has a through-hole therein extending through said metal lead and said pre-molded plastic substrate wherein an external signal can enter through said through-hole and reach said at least one MEMS device.

5. The package according to claim 1 wherein said at least one MEMS device is attached to said one of said pre-molded lead-frame substrates by adhesives.

6. The package according to claim 1 wherein said first pre-molded lead-frame substrate is joined to said second pre-molded lead-frame substrate by an adhesive paste or pre-cut adhesive film.

7. A MEMS package comprising:
 a first and a second pre-molded lead-frame substrate, at least one of them having a cavity formed by plastic sidewalls along its periphery, wherein said first and second pre-molded lead-frame substrates are interconnected with metal leads; and
 at least one MEMS device attached to one of said substrates wherein said substrate has a through-hole therein extending through said substrate wherein an external signal can enter through said through-hole and reach said at least one MEMS device and wherein said first pre-molded lead-frame substrate is folded over and joined to said second pre-molded lead-frame substrate to house said at least one MEMS device.

8. The package according to claim 7 wherein said first pre-molded lead-frame substrate has metal leads extending outside of sidewalls of said cavity wherein extended said metal leads are folded over the top of said second pre-molded lead-frame substrate to form surface mounting pads.

9. The package according to claim 7 wherein said first pre-molded lead-frame substrates has metal leads extending outside of sidewalls of said cavity wherein extended said metal leads are folded along said side walls and connected to ground for electromagnetic interference shielding.

10. The package according to claim 7 wherein said at least one MEMS device is attached to said one of said pre-molded lead-frame substrates by adhesives.

11. The package according to claim 7 wherein said first pre-molded lead-frame substrate is joined to said second pre-molded lead-frame substrate by an adhesive paste or a pre-cut adhesive film.

12. A MEMS package comprising:
 a first and a second pre-molded lead-frame substrate, at least one of them having a cavity formed by plastic sidewalls along its periphery, wherein said first and second pre-molded lead-frame substrates are interconnected with metal leads; and
 at least one MEMS device attached to one of said substrates wherein said first pre-molded lead-frame substrate is folded over and joined to said second pre-molded lead-frame substrate to house said at least one MEMS device and wherein said first pre-molded lead-frame substrate has metal leads extending outside of sidewalls of said cavity wherein extended said metal leads are trimmed and folded over the top of said second pre-molded lead-frame substrate to form surface mounting pads.

13. The package according to claim 12 wherein said first pre-molded lead-frame substrate has metal leads extending outside of sidewalls of said cavity wherein extended said metal leads are trimmed and folded along said side walls and connected to ground for electromigration shielding.

14. The package according to claim 12 wherein one of said metal leads has a through-hole therein extending through said metal lead and said pre-molded plastic substrate wherein an external signal can enter through said through-hole and reach said at least one MEMS device.

15. The package according to claim 12 wherein said at least one MEMS device is attached to said one of said pre-molded lead-frame substrates by adhesives.

16. The package according to claim 1 wherein said first pre-molded lead-frame substrate is joined to said second pre-molded lead-frame substrate by an adhesive paste or pre-cut adhesive film.

* * * * *